(12) United States Patent
Park et al.

(10) Patent No.: US 11,334,787 B2
(45) Date of Patent: May 17, 2022

(54) NEURON CIRCUIT

(71) Applicant: Seoul National University R&DB Foundation, Seoul (KR)

(72) Inventors: ByungGook Park, Seoul (KR); Jeong-Jun Lee, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 496 days.

(21) Appl. No.: 16/509,399

(22) Filed: Jul. 11, 2019

(65) Prior Publication Data

US 2020/0019835 A1 Jan. 16, 2020

(51) Int. Cl.
*G06N 3/063* (2006.01)
*H03K 3/037* (2006.01)
*G06N 3/02* (2006.01)
*H03K 3/355* (2006.01)

(52) U.S. Cl.
CPC .............. *G06N 3/063* (2013.01); *G06N 3/02* (2013.01); *H03K 3/037* (2013.01); *H03K 3/355* (2013.01)

(58) Field of Classification Search
CPC ............................. H03K 3/355; G06N 3/063
See application file for complete search history.

(56) References Cited

U.S. PATENT DOCUMENTS 9,087,302 B2 * 7/2015 Sim .......................... G11C 7/16
9,805,302 B2 * 10/2017 Kim ....................... G11C 11/54

FOREIGN PATENT DOCUMENTS

| KR | 10-2010-0129741 A | 12/2010 |
| KR | 10-2012-0136015 A | 12/2012 |
| KR | 10-2014-0141778 A | 12/2014 |

(Continued)

OTHER PUBLICATIONS

Lee, J-J., et al., SPICE Simulation of the Neuromorphic System Composed of Neuron Circuit and Synaptic Device, M. S. Dissertation, Department of Electrical Engineering and Computer Science, College of Engineering, Seoul National University, Feb. 2018, 51 pgs.

(Continued)

*Primary Examiner* — Patrick O Neill
(74) *Attorney, Agent, or Firm* — Procopio, Cory, Hargreaves & Savitch LLP

(57) ABSTRACT

Disclosed is a neuron circuit in which an overflow signal before fire is retained after the fire. The neuron circuit according to an embodiment of the inventive concept includes a synapse element, a synaptic integration unit and a pulse generation unit. The synapse element receives output signals of a pre-neuron circuit and a post-neuron circuit. The synaptic integration unit includes a capacitor charged by the current flowing into the synapse element depending on the output signals of the pre-neuron circuit and the post-neuron circuit. The pulse generation unit generates an output pulse from the charging voltage of the capacitor. The pulse generation unit includes a pulse generation circuit generating the output pulse depending on the charging voltage of the capacitor and an overflow signal retaining unit connected between the capacitor and the pulse generation circuit and retaining an overflow signal, which exceeds a threshold voltage among the charging voltage of the capacitor after the pulse generation unit fires.

8 Claims, 10 Drawing Sheets

(56) References Cited

FOREIGN PATENT DOCUMENTS

KR   1020150034900 A   4/2015
WO   2009/113993 A1    9/2009

OTHER PUBLICATIONS

Lee, J. et al., "Implementation of Neuromorphic System with Neuron Circuit Retaining Overflow", The 25th Korean Conference on Semiconductors, Feb. 5-7, 2018, Gangwon-do, Republic of Korea (16 pages).
Indiveri, G. "A low-power adaptive integrate-and-fire neuron circuit" ISCAS, 2003; pp. 820-823 (4 pages).
Liu, S. et al., "Temporal Coding in a Silicon Network of Integrate-and-Fire Neurons," IEEE Transaction on Neural Networks, Sep. 2004, pp. 1305-1314, vol. 15, No. 5.
Park, J. et al., "Neuromorphic System Based on CMOS Inverters and Si-Based Synaptic Device," Journal of Nanoscience and Nanotechnology, 2016, pp. 4709-4712, vol. 16 (4 pages).
Sourikopoulos, I. et al. "A 4-fJ/Spike Artificial Neuron in 65nm CMOS Technology" Frontiers (Original Research Article), Mar. 15, 2017; 21 pages.

\* cited by examiner

NEURON CIRCUIT

CROSS-REFERENCE TO RELATED APPLICATIONS

This application claims priority under 35 U.S.C. § 119 to Korean Patent Application No. 10-2018-0081065 filed on Jul. 12, 2018, in the Korean Intellectual Property Office, the disclosures of which are incorporated by reference herein in their entireties.

BACKGROUND

Embodiments of the inventive concept described herein relate to a neuron circuit, and more particularly, relate to a neuron circuit in which an overflow signal before fire is retained after fire.

The neuromorphic system that mimics a neuron and a synapse has been studied to implement artificial intelligence (AI) in hardware. For the purpose of having the efficient computing method for high-level computation such as recognition and inference, a synapse element and a neuron circuit have been studied to electrically implement the biological nervous system away from the existing Von Neumann architecture. When the signal accumulated at an accumulation terminal of a capacitor by the synapse element exceeds the threshold voltage, each neuron circuit in the neural-network fires.

When the voltage is gradually accumulated in a capacitor depending on the signal from the synapse element and then the voltage of the threshold or more is accumulated, the conventional neuron circuit fires. After the neuron circuit fires, the signal of the accumulation terminal of the capacitor returns to 0 V that is an initial state. That is, when the neuron circuit fires, an overflow signal exceeding the threshold voltage is discarded after being fired. Due to the discarded overflow signal, the information included in the overflow signal may be lost and the accuracy of the pattern recognition of the neural-network may be reduced.

SUMMARY

Embodiments of the inventive concept provide a neuron circuit in which an overflow signal before fire is retained after fire.

The task to be solved by the inventive concept is not limited to the above-mentioned problems. Other problems which are not mentioned will be clearly understood from the following description to those skilled in the art.

According to an exemplary embodiment, a neuron circuit includes a synapse element receiving output signals of a pre-neuron circuit and a post-neuron circuit, a synaptic integration unit including a capacitor charged by a current flowing into the synapse element depending on the output signals of the pre-neuron circuit and the post-neuron circuit, and a pulse generation unit generating an output pulse from a charging voltage of the capacitor. A weight of the synapse element is changed depending on the output signals of the pre-neuron circuit and the post-neuron circuit. The output pulse is fed back to the synapse element as the output signal of the post-neuron circuit.

The pulse generation unit includes a pulse generation circuit generating the output pulse depending on the charging voltage of the capacitor and an overflow signal retaining unit connected between the capacitor and the pulse generation circuit and retaining an overflow signal, which exceeds a threshold voltage among the charging voltage of the capacitor after the pulse generation unit fires.

The overflow signal retaining unit may include a first inverter circuit receiving the charging voltage of the capacitor and a second inverter circuit receiving an output signal of the first inverter circuit, and the overflow signal retaining unit may be configured to copy the charging voltage of the capacitor to store the copied charging voltage in an output terminal of the second inverter circuit.

The capacitor may be reduced by the overflow signal retaining unit from the charging voltage by the threshold voltage upon firing the pulse generation unit.

The overflow signal retaining unit may further include a capacitor element connected between the output terminal of the second inverter circuit and a ground.

The pulse generation circuit may include a first transistor, a first inverter inverting and outputting the charging voltage of the capacitor, which is copied to the output terminal of the second inverter circuit, a second inverter inverting the output signal of the first inverter and outputting the inverted output signal to a drain or a source of the first transistor, and a second transistor. The charging voltage of the capacitor may be input, which is copied to the output terminal of the second inverter circuit is input to a gate of the first transistor. An output signal the second inverter may be input to a gate of the second transistor, and the second transistor may discharge the output terminal of the second inverter circuit depending on the output signal of the second inverter.

The pulse generation circuit may further include a third transistor. An output pulse of the second inverter may be input to a gate of the third transistor, and one of a drain and a source of the third transistor may be connected to a charging terminal of the capacitor and the other is grounded.

The synapse element may include an excitation synapse element and an inhibition synapse element. The excitation synapse element may include a first transistor element. The inhibition synapse element may include a second transistor element. The output signal of the pre-neuron circuit may be input to a first gate of each of the first transistor element and the second transistor element, and the output signal of the post-neuron circuit may be input to a second gate of each of the first transistor element and the second transistor element.

The synaptic integration unit may further include a current mirror connected between the synapse element and the capacitor. The current mirror may be connected to the excitation synapse element and the inhibition synapse element such that a current constantly flows into the excitation synapse element or the inhibition synapse element depending on the output signals of the pre-neuron circuit and the post-neuron circuit, and may output a differential current between the excitation synapse element and the inhibition synapse element to the capacitor. The capacitor may be isolated from the current flowing into the excitation synapse element and the inhibition synapse element by the current mirror and is charged by the differential current.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
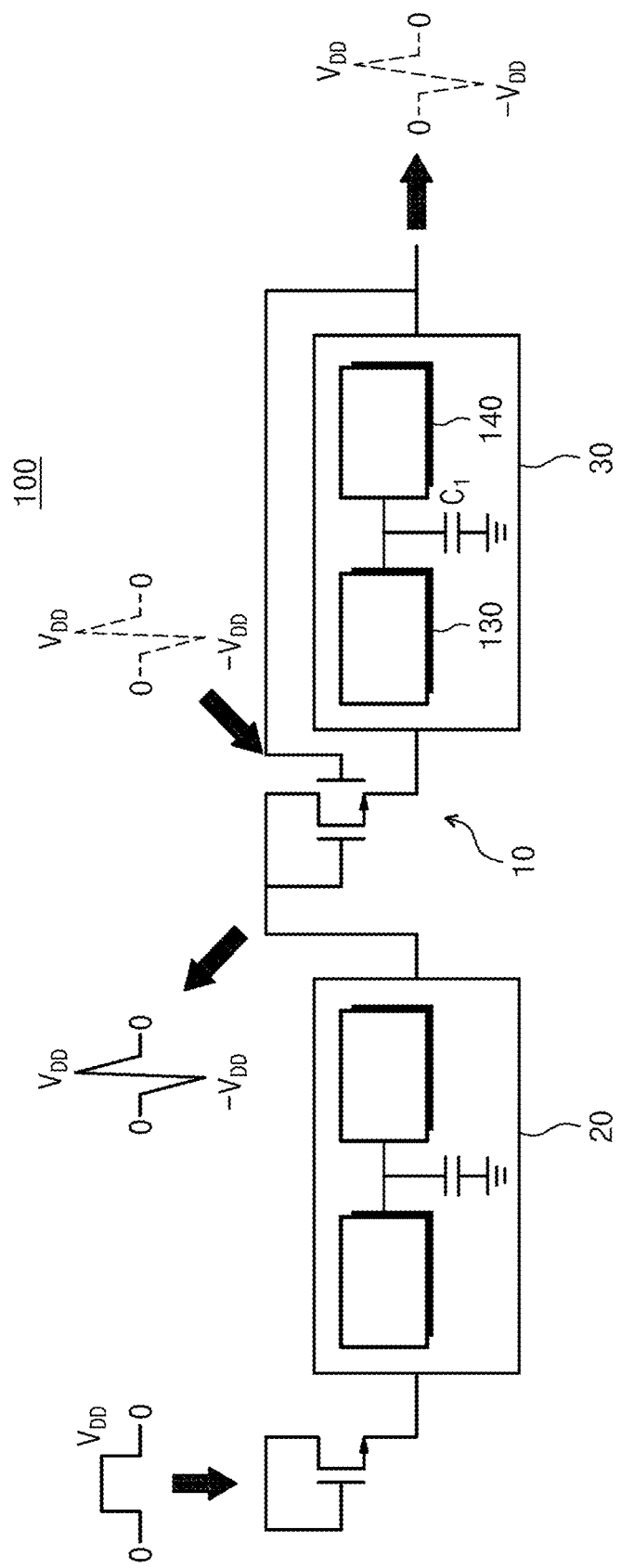
FIG. 1 is a configuration diagram of a neuron circuit, according to an embodiment of the inventive concept.

According to an embodiment of the inventive concept, other advantages and features and methods of accomplishing the same may be understood more readily with reference to the following detailed description of an embodiment and the accompanying drawings. However, the inventive concept is not limited to the embodiments set forth herein; the inventive concept will only be defined by the appended claims. Even though it is not defined, all terms (including technical or scientific terms) used herein, all terms have the same meaning as being generally accepted by the general technology in the art belonging to inventive concept. General descriptions about the well-known configurations may be omitted so as not to obscure the subject matter of the inventive concept. A configuration which is equal to or corresponds to drawings in the inventive concept is possible using the same reference numerals. For the purpose of giving the understanding of the inventive concept, some configurations in the drawings may be illustrated to be somewhat exaggerated or reduced.

The terminology used herein to describe embodiments is not intended to limit the scope of the inventive concept. The articles "a," "an," and "the" are singular in that they have a single referent, however, the use of the singular form in the inventive concept should not preclude the presence of more than one referent. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

FIG. 1 is a configuration diagram of a neuron circuit, according to an embodiment of the inventive concept. Referring to FIG. 1, a neuron circuit 100 includes a synapse element 10, a pre-neuron circuit 20, and a post-neuron circuit 30.

The synapse element 10 is configured to receive the output signal of the pre-neuron circuit 20 and to receive the output signal of the post-neuron circuit 30, which has been fed back. The weight of the synapse element 10 may be changed by the timing difference between the output signals of the pre-neuron circuit 20 and the post-neuron circuit 30.

In an embodiment, the synapse element 10 may be provided as a transistor element; the drain or source of the transistor element is connected to the gate of transistor element. The transistor element may be provided as a double-gate transistor.

The weight of the synapse element 10 may increase or decrease depending on the timing difference between the output signal of the pre-neuron circuit 20 input to a first gate and the output signal of the post-neuron circuit 30 fed back to a second gate.

Because the structures of the pre-neuron circuit 20 and the post-neuron circuit 30 are provided to be the same as each other, the neuron circuit will be described below based on the structure of the post-neuron circuit 30.

Figure 2:
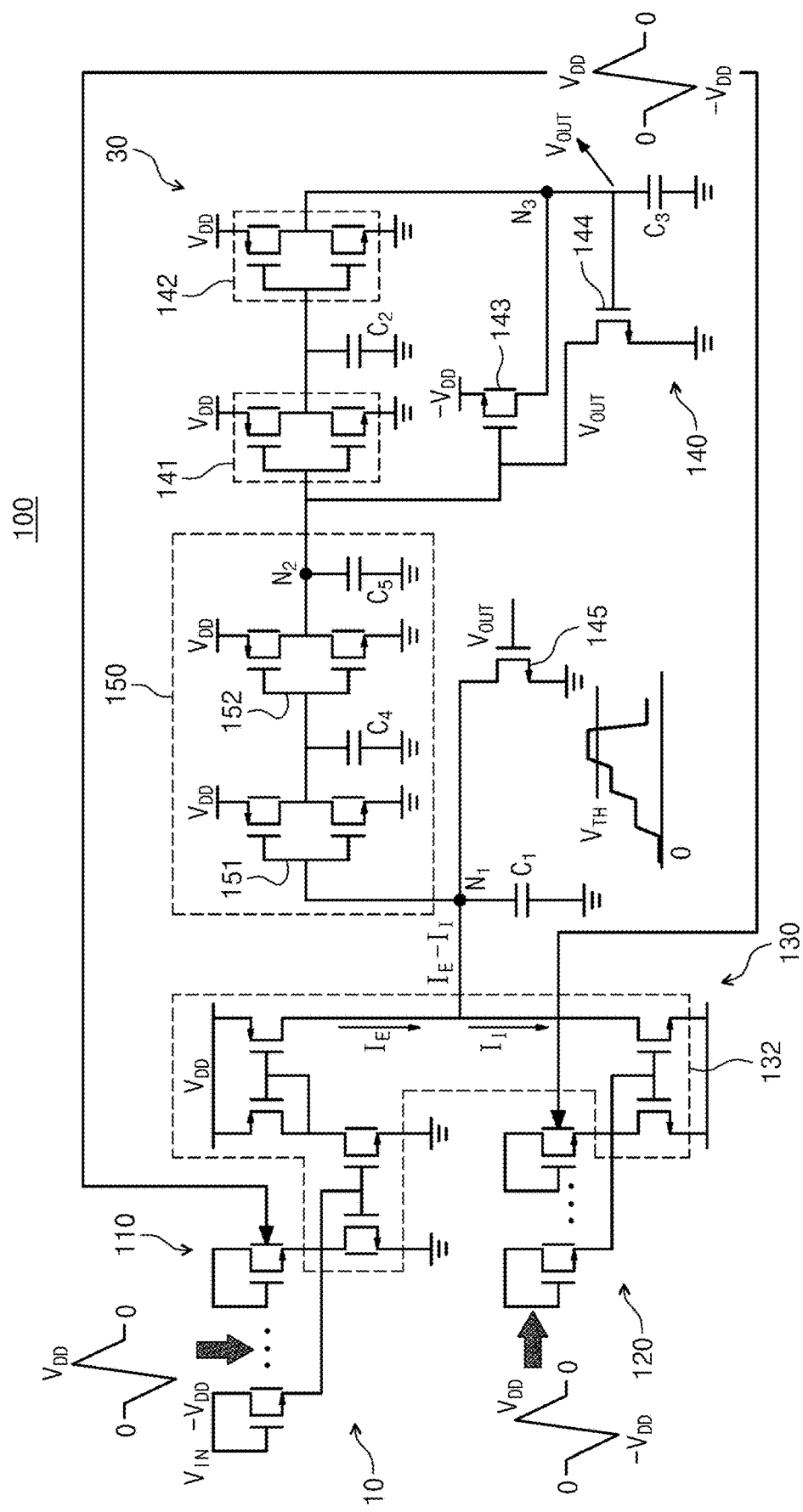
FIG. 2 is a configuration diagram concretely illustrating a neuron circuit, according to an embodiment of the inventive concept.

FIG. 2 is a configuration diagram concretely illustrating a neuron circuit, according to an embodiment of the inventive concept. Referring to FIGS. 1 and 2, the post-neuron circuit 30 may include a synaptic integration unit 130 and a pulse generation unit 140.

The synaptic integration unit 130 may accumulate the current flowing into the synapse element 10 in the capacitor $C_1$ in response to the output signals of the pre-neuron circuit 20 and the post-neuron circuit 30. The charging voltage (cumulative voltage) accumulated at the accumulation terminal N1 of the capacitor $C_1$ is input to the pulse generation unit 140.

The pulse generation unit 140 generates an output pulse $V_{OUT}$ from the signal accumulated in the capacitor $C_1$ by the synaptic integration unit 130. In the embodiment illustrated in FIG. 2, the pulse generation unit 140 is configured to generate an asymmetrical output pulse. The output pulse $V_{OUT}$ is fed back to the second gate of the synapse element 10 as the output signal of the post-neuron circuit 30.

As illustrated in FIGS. 1 and 2, the output pulse $V_{OUT}$ may be the asymmetric pulse signal of a waveform that is not bilaterally symmetrical. In an embodiment, the asymmetrical output pulse may be a signal of a waveform of point symmetry, not bilateral symmetry. However, the output pulse is not limited to the asymmetrical output pulse illustrated above; the output pulse may be output as the pulse signal of the bilaterally symmetrical waveform or may be output as the pulse signal in various other forms.

The synapse element 10 may include an excitation synapse element 110 and an inhibition synapse element 120. In an embodiment, the synapse element 10 may be provided as a 4-terminal element. The excitation synapse element 110 includes one or more first transistor elements.

Figure 3:
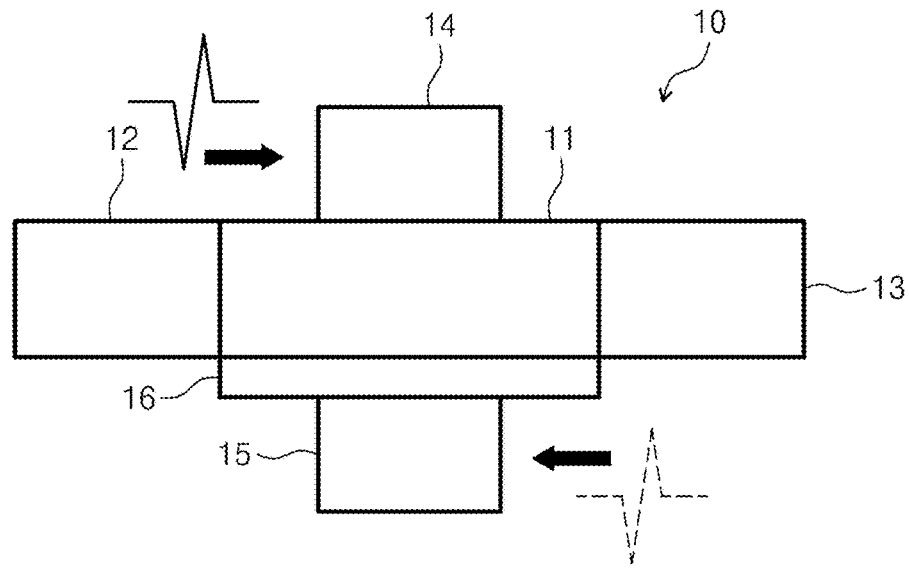
FIG. 3 is a configuration diagram of a synapse element constituting a neuron circuit, according to an embodiment of the inventive concept.

FIG. 3 is a configuration diagram of a synapse element constituting a neuron circuit, according to an embodiment of the inventive concept. In a transistor element constituting the synapse element 10, two or more gates 14 and 15 are insulated and then are formed in a body 11 formed between a source 12 and a drain 13; the output signal of the pre-neuron circuit 20 is input to the first gate 14; and the output signal of the post-neuron circuit 30 is input to the second gate 15.

Returning to FIGS. 1 and 2, the inhibition synapse element 120 includes one or more second transistor elements. The output signal $V_{IN}$ of the pre-neuron circuit 20 is input to the first gate of the second transistor element; the output signal of the post-neuron circuit 30 is input to the second gate of the second transistor element.

Each of the excitation synapse element 110 and the inhibition synapse element 120 may be provided as the structure in which the drain (or source) and the gate of the transistor element are connected to each other; the weight may be changed depending on the timing difference between output signals of the pre-neuron circuit 20 and the post-neuron circuit 30.

Figure 4:
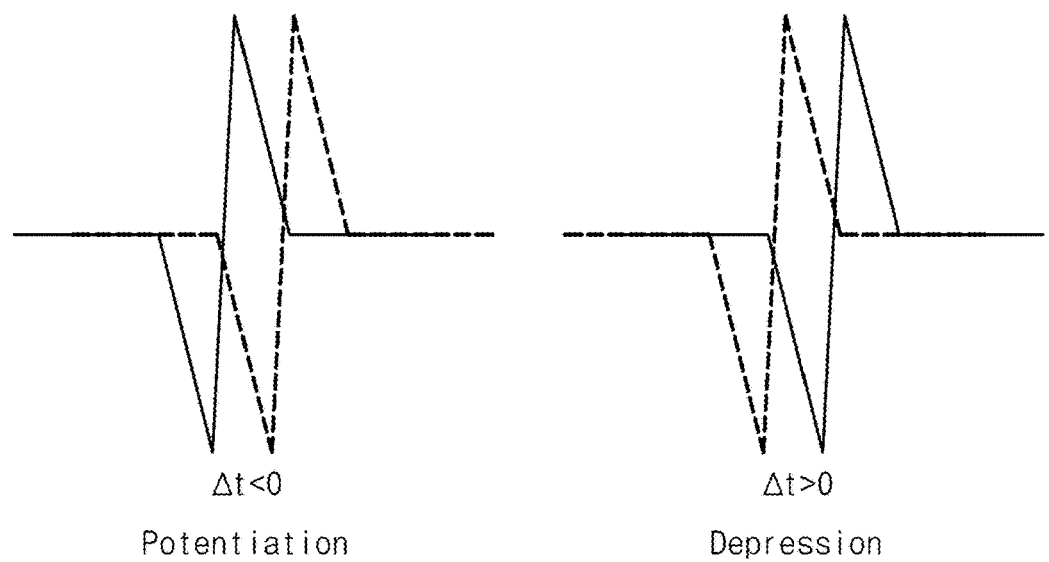
FIG. 4 is a view for describing a principle by which a weight of a synapse element constituting a neuron circuit is changed, according to an embodiment of the inventive concept.

FIG. 4 is a view for describing a principle by which a weight of a synapse element constituting a neuron circuit is changed, according to an embodiment of the inventive concept. The weight of the synapse element having four terminals is changed by the timing difference between a pre-neuron signal and a post-neuron signal input after being fed back.

The process in which the weight of the synapse element is changed by the timing difference between the pre-neuron signal and the post-neuron signal may be referred to as Spike Timing Dependent Plasticity (STDP). When the pre-neuron signal is first input to the synapse element and then the post-neuron signal is input, the weight of the synapse element increases by potentiation. On the other hand, when the post-neuron signal is first input to the synapse element and then the pre-neuron signal is input, the weight of the synapse element decreases by depression.

As illustrated in FIG. 4, the asymmetrical output pulse changed in order of (—)→(+) is suitable for mimicking the STDP of the real natural world. Even in the real natural world, the weight of the synapse increases (potentiation) at the timing at which the pre-neuron signal is input prior to the post-neuron signal; on the other hand, the weight of the synapse decreases (depression) at the timing at which the post-neuron signal is input prior to the pre-neuron signal.

Returning to FIG. 2, the synaptic integration unit 130 may include a current mirror 132 and a capacitor $C_1$. The current mirror 132 is connected between the synapse element 10 and the capacitor $C_1$.

The current mirror 132 is connected to the drain or the source of the excitation synapse element 110 and the inhibition synapse element 120 such that the current constantly flows into the excitation synapse element 110 or the inhibition synapse element 120 depending on the output signals of the pre-neuron circuit 20 and the post-neuron circuit 30 regardless of the change of the voltage charged in the capacitor $C_1$.

The current mirror 132 may output the differential current $I_E$-$I_I$ between the excitation synapse element 110 and the inhibition synapse element 120 to the capacitor $C_1$. The capacitor $C_1$ is isolated by the current mirror 132 from the current $I_E$ flowing into the excitation synapse element 110 and the current $I_I$ flowing into the inhibition synapse element 120. The capacitor $C_1$ may be charged by the differential current $I_E$-$I_I$ generated by the current mirror 132.

The capacitor $C_1$ may be charged by the differential current corresponding to the difference between the current $I_E$ flowing into the excitation synapse element 110 and the current $I_I$ flowing into the inhibition synapse element 120. Accordingly, the current flowing into the capacitor $C_1$ may be reduced and the size of a circuit may be reduced by reducing the capacity of the capacitor $C_1$. The amount of current flowing into the capacitor $C_1$ may be adjusted by designing the channel width and the channel distance of the current mirror 132, and thus the capacity and the size of the capacitor $C_1$ may be adjusted.

The pulse generation unit 140 includes pulse generation circuits 141 to 145 and an overflow signal retaining unit 150. The pulse generation circuits 141 to 145 operate depending on the output terminal signal of the overflow signal retaining unit 150 to generate an output pulse. The pulse generation circuits 141 to 145 may include the two inverters 141 and 142, which are serially connected to each other, the first transistor 143, the second transistor 144, and the third transistor 145.

The first inverter 141 inverts the output signal of the overflow signal retaining unit 150 that is a virtual membrane signal and then outputs the inverted output signal. The output terminal of the first inverter 141 is connected to the input terminal of the second inverter 142. The second inverter 142 inverts the output signal of the first inverter 141 and then outputs the inverted output signal to the output terminal.

A first capacitor element $C_2$ may be provided between the output terminal of the first inverter 141 and the ground. A second capacitor element $C_3$ may be connected between the output terminal of the second inverter 142 and the ground.

The output signal of the second inverter 142 corresponds to the output pulse $V_{OUT}$ of the pulse generation unit 140. The output pulse $V_{OUT}$ generated at an output terminal N3 of the pulse generation unit 140 is fed back as the output signal of the post-neuron circuit 30 and then is input to the second gate of the synapse element 10.

The output signal of a virtual membrane node N2 output by the overflow signal retaining unit 150 is input to the gate of the first transistor 143. A third capacitor element C5 may be connected between the virtual membrane node N2 that is the output terminal of the overflow signal retaining unit 150 and the ground.

The second capacitor element $C_3$ may be connected to the drain (or source) of the first transistor 143. The operating voltage (e.g., $V_{DD}$ or $-V_{DD}$) may be applied to the source (or drain) of the first transistor 143.

The gate of the second transistor 144 may be connected to the output terminal N3 of the second inverter 142; the source (or drain) thereof may be grounded or the operating voltage may be applied to the source (or drain); the drain (or source) may be connected to the gate of the first transistor 143. The second transistor 144 may discharge the third capacitor element C5 depending on the output pulse $V_{OUT}$ that is the output signal of the second inverter 142.

The first transistor 143 and the second transistor 144 may be provided as the transistor of a complementary type. In the embodiment of FIG. 2, the first transistor 143 may be provided as p-type MOSFET; the second transistor 144 may be provided as n-type MOSFET, but vice versa.

The output pulse $V_{OUT}$ of the second inverter 142 is input to the gate of the third transistor 145. The drain (or source) of the third transistor 145 may be connected to the charging terminal of the capacitor $C_1$; the source (or drain) thereof may be grounded or the operating voltage may be applied to the source (or drain). The third transistor 145 discharges the capacitor $C_1$ in response to the signal of the output pulse $V_{OUT}$ of the second inverter 142.

The overflow signal retaining unit 150 may be provided such that the overflow signal before fire is retained by the output pulse the pulse generation unit 140 after the fire. The overflow signal retaining unit 150 may be connected between an accumulation terminal N1, which is the charging node of the capacitor $C_1$, and the virtual membrane node N2, which is the input terminal of the first inverter 141.

The overflow signal retaining unit 150 is configured to copy the signal of the accumulation terminal N1 of the capacitor $C_1$ to the output terminal (virtual membrane node), to drive an output pulse generation circuit, and to generate an output pulse. The overflow signal retaining unit 150 may include two inverter circuits serially connected to each other.

The overflow signal retaining unit 150 may include a first inverter circuit 151 and a second inverter circuit 152. The first inverter circuit 151 inverts the charging voltage of the capacitor $C_1$ to output the inverted charging voltage. The output terminal of the first inverter circuit 151 is connected to the input terminal of the second inverter circuit 152.

The second inverter circuit 152 inverts the output signal of the first inverter circuit 151 and then outputs the inverted output signal to the output terminal. The output signal of the second inverter circuit 152 is input to the input terminal of the first inverter 141. A fourth capacitor element $C_4$ may be connected between the output terminal of the first inverter circuit 151 and the ground.

Hereinafter, according to an embodiment of the inventive concept, the procedure in which an output pulse is generated and the principle by which the overflow signal before fire is retained after the fire will be described. The current from the synapse element 10 charges the capacitor $C_1$ via the current mirror 132.

When the voltage of a specific level or more is charged in the capacitor $C_1$, the virtual membrane signal is accumulated at the virtual membrane node N2 and then the first transistor 143 is turned on by the virtual membrane signal. As a result, the first transistor 143 reduces the voltage of the output pulse $V_{OUT}$ of the output terminal N3 of the pulse generation unit 140 from 0 V to $-V_{DD}$.

While the voltage of the output terminal of the pulse generation unit 140 is reduced, the two inverters 141 and 142 operate. Due to the delay of the inverters 141 and 142, the voltage of the output terminal $V_{OUT}$ is dropped by the operation of the first transistor 143 to $-V_{DD}$ and then the charging voltage of the capacitor $C_1$ is output to the output terminal N3 of the second inverter 142, and thus the voltage of the output terminal $V_{OUT}$ increases from $-V_{DD}$ to $+V_{DD}$ again.

Lastly, when the voltage of the output terminal $V_{OUT}$ of the pulse generation unit 140 increases to $+V_{DD}$, the third transistor 145 operates and then the capacitor $C_1$ is discharged. Accordingly, the voltage of the output terminal $V_{OUT}$ of the pulse generation unit 140 returns to 0 V that is the original state.

According to an embodiment of the inventive concept, the asymmetrical pulse generation unit 140 composed of six transistors may generate an asymmetrical output pulse, and the number of transistors necessary to make the asymmetrical output pulse may be reduced. Accordingly, the neuron circuit of low-power and low-area may be implemented.

Unlike Von Neumann architecture, in the neuron circuit according to an embodiment of the inventive concept, as training is performed, the weight is changed simultaneously. Furthermore, as the output signal is fed back to the 4-terminal synapse element 10, the weight is changed automatically. Accordingly, there is no need for an additional controller or there is no need for the process of updating the weight.

Furthermore, a neuron circuit according to an embodiment of the inventive concept may have the structure in which a memory and a processor are integrated because the weight is stored in the 4-terminal synapse element and may be configured to have a great parallel structure. Accordingly, it is expected that the large power consumption in a flexible structure may be reduced.

Figure 5:
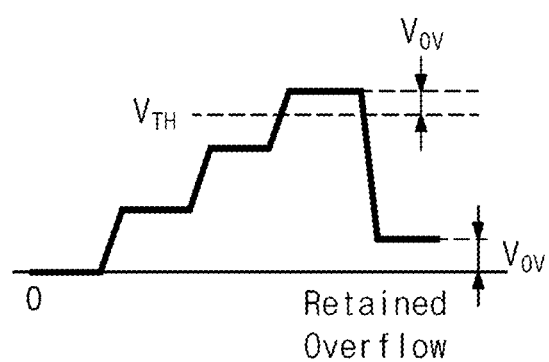
FIG. 5 is a view for describing an operation of an overflow signal retaining unit constituting a neuron circuit, according to an embodiment of the inventive concept.

FIG. 5 is a view for describing an operation of an overflow signal retaining unit constituting a neuron circuit, according to an embodiment of the inventive concept. Referring to FIGS. 2 and 5, the charging voltage of the accumulation terminal N1 of the capacitor $C_1$ is transmitted to the virtual membrane node N2 that is the output terminal of the overflow signal retaining unit 150; the output pulse $V_{OUT}$ is formed depending on the cumulative voltage of the virtual membrane node N2.

Accordingly, the capacitor $C_1$ independently operates without being affected by the operations of the first transistor 143 and the second transistor 144 for generating the output pulse $V_{OUT}$. While the capacitor $C_1$ is discharged, the voltage of the membrane node of the accumulation terminal N1 of the capacitor $C_1$ may be reduced by a specific level (e.g., a threshold voltage) and may retain an overflow signal $V_{OV}$ after fire, thereby improving the accuracy of pattern recognition.

Figure 6:
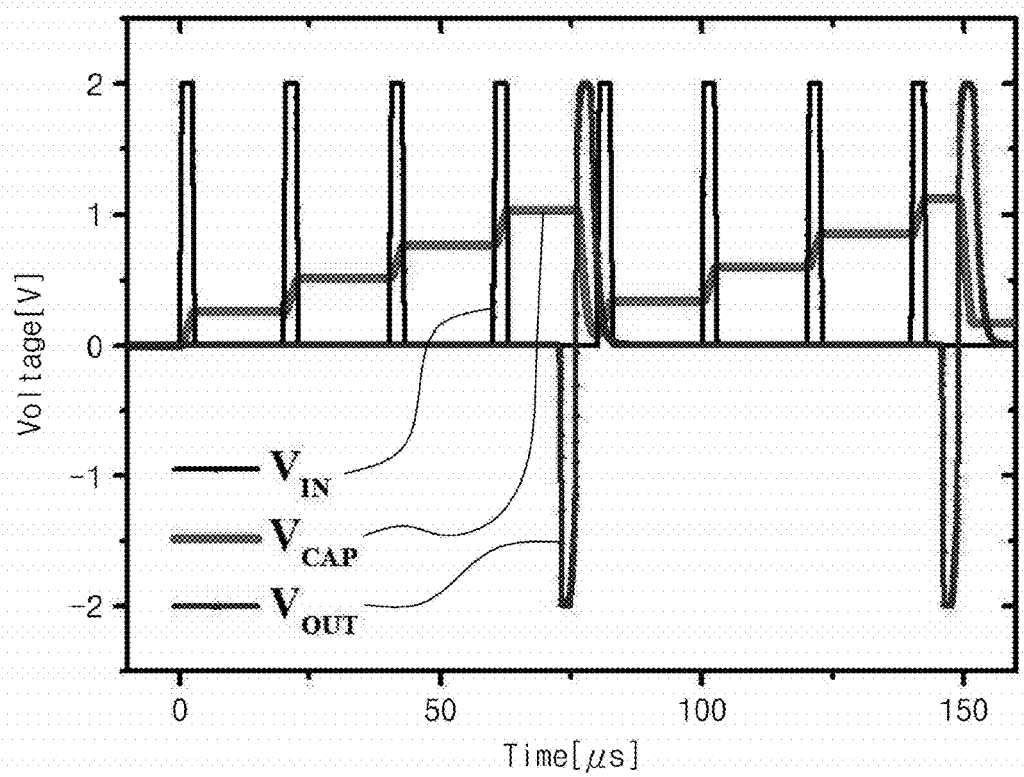
FIG. 6 is a simulation result illustrating the performance of retaining an overflow signal of a neuron circuit, according to an embodiment of the inventive concept.
Figure 7:
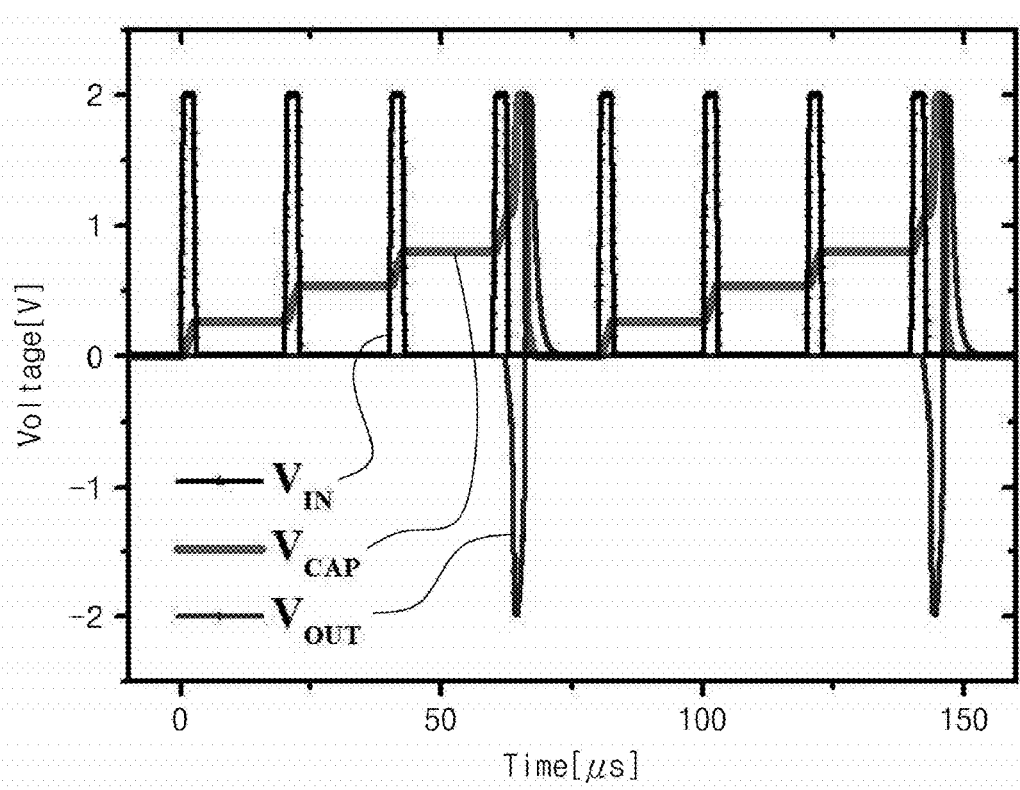
FIG. 7 is the result of simulating a neuron circuit not having a function of retaining an overflow signal.

FIG. 6 is a simulation result illustrating the performance of retaining an overflow signal of a neuron circuit, according to an embodiment of the inventive concept. FIG. 7 is the result of simulating a neuron circuit not having a function of retaining an overflow signal. In FIGS. 6 and 7, $V_{OUT}$ denotes the output pulse of a neuron circuit; $V_{IN}$ denotes an input pulse; and $V_{CAP}$ denotes the voltage of the accumulation terminal of a capacitor.

As illustrated in FIG. 6, the voltage is accumulated in the accumulation terminal of a capacitor through a synapse element by input pulses; when the accumulated voltage exceeds a threshold voltage, an output pulse is generated and then is fired. It may be understood that the voltage of the accumulation terminal of the capacitor after the fire is not completely discharged to 0 V and the overflow signal before the fire is retained after the fire. On the other hand, in the case of the neuron circuit not having a function of retaining an overflow signal, as illustrated in FIG. 7, the voltage of the accumulation terminal of the capacitor after the fire is discharged to 0 V, and information about the overflow signal before the fire fails to be utilized.

For example, when the threshold voltage is 1 V and the voltage of the accumulation terminal of the capacitor is 1.2 V, after the neuron circuit according to an embodiment of the inventive concept fires, the overflow signal of 0.2 V is retained at the accumulation terminal of the capacitor. On the other hand, in the case of the neuron circuit not having a function of retaining an overflow signal, the overflow signal of 0.2 V is not retained at the accumulation terminal of the capacitor after the fire.

Afterward, when the procedure in which the same signal is accumulated and fired is repeated four times, the neuron circuit not having a function of retaining an overflow signal performs a fire operation five times. On the other hand, the neuron circuit according to an embodiment of the inventive concept performs the fire operation six times. Accordingly, the number of fires increases by 20%.

Figure 8:
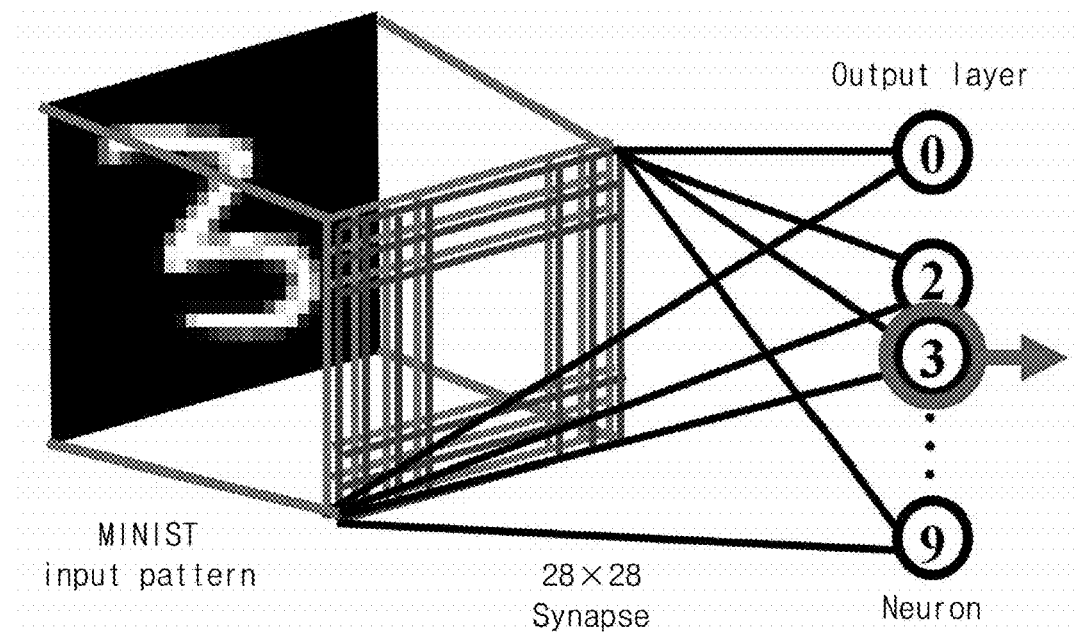
FIGS. 8 to 10 are views illustrating a pattern recognition simulation result of a neuron circuit, according to an embodiment of the inventive concept.
Figure 9:
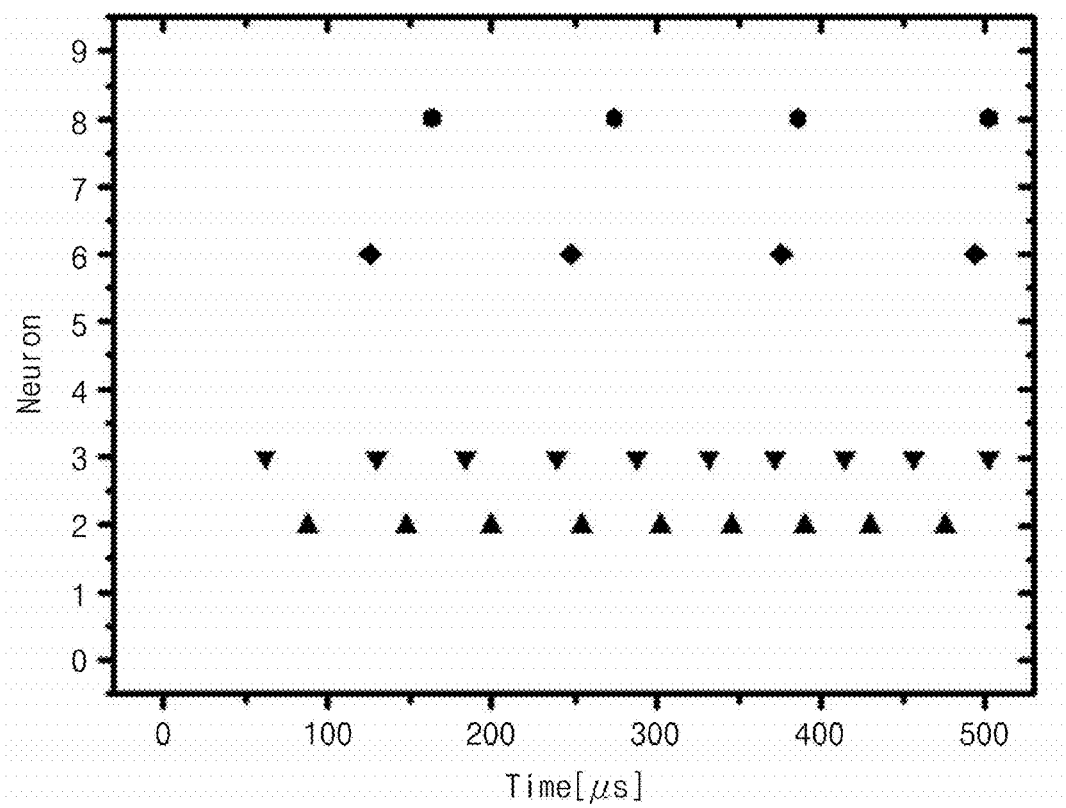
Figure 10:
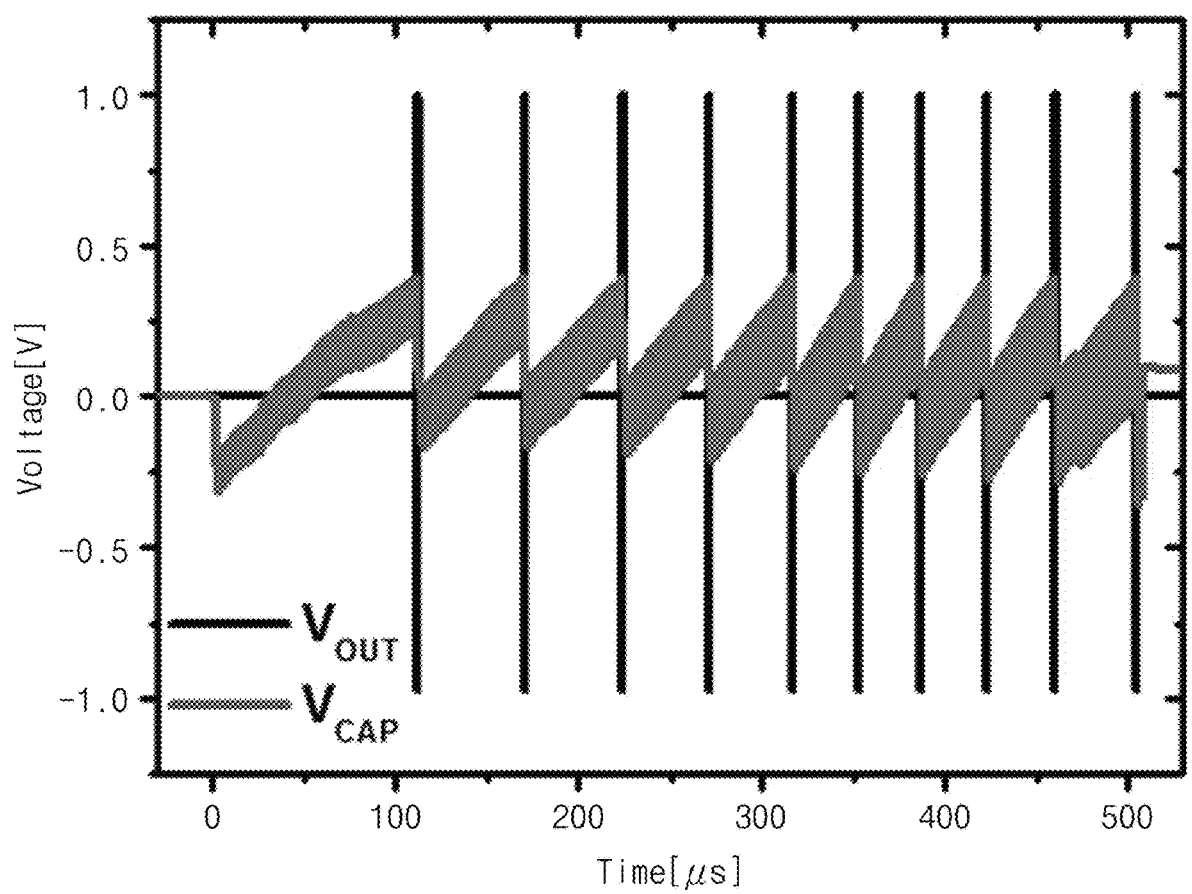
Figure 11:
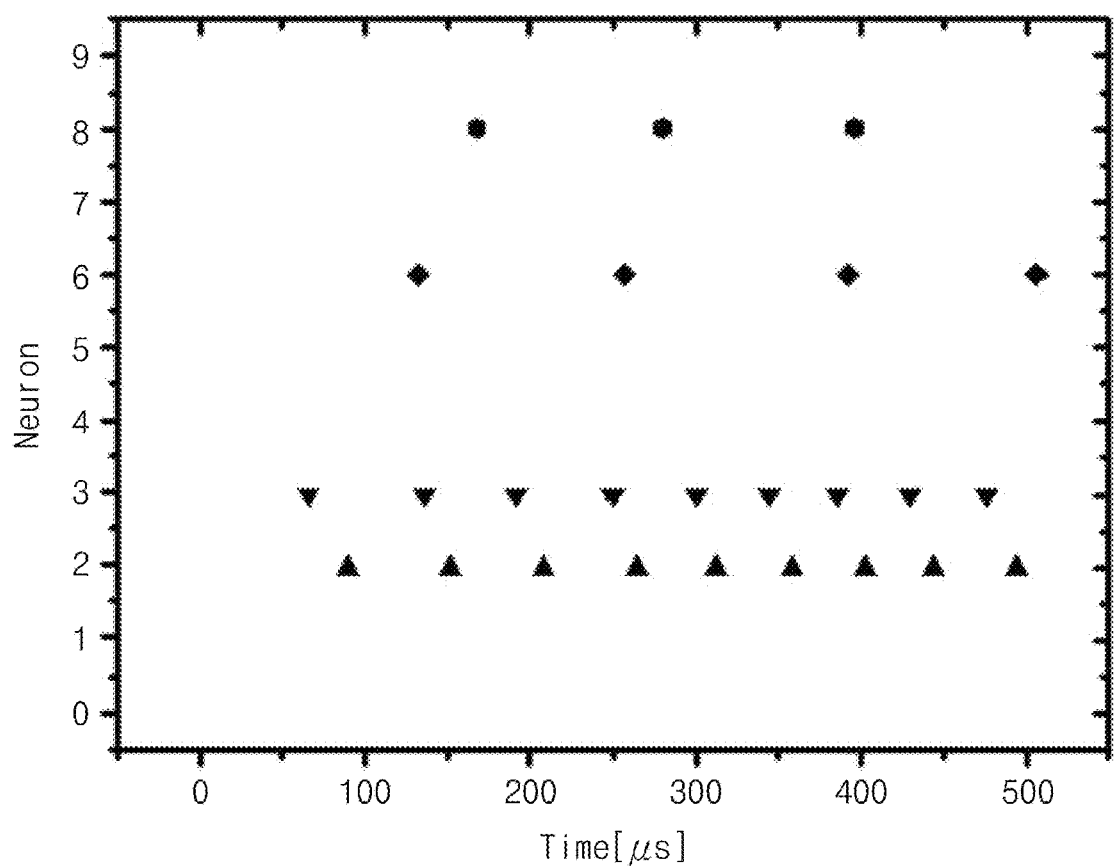
FIGS. 11 to 12 are views illustrating a pattern recognition simulation result of a neuron circuit not having a function of retaining an overflow signal.
Figure 12:
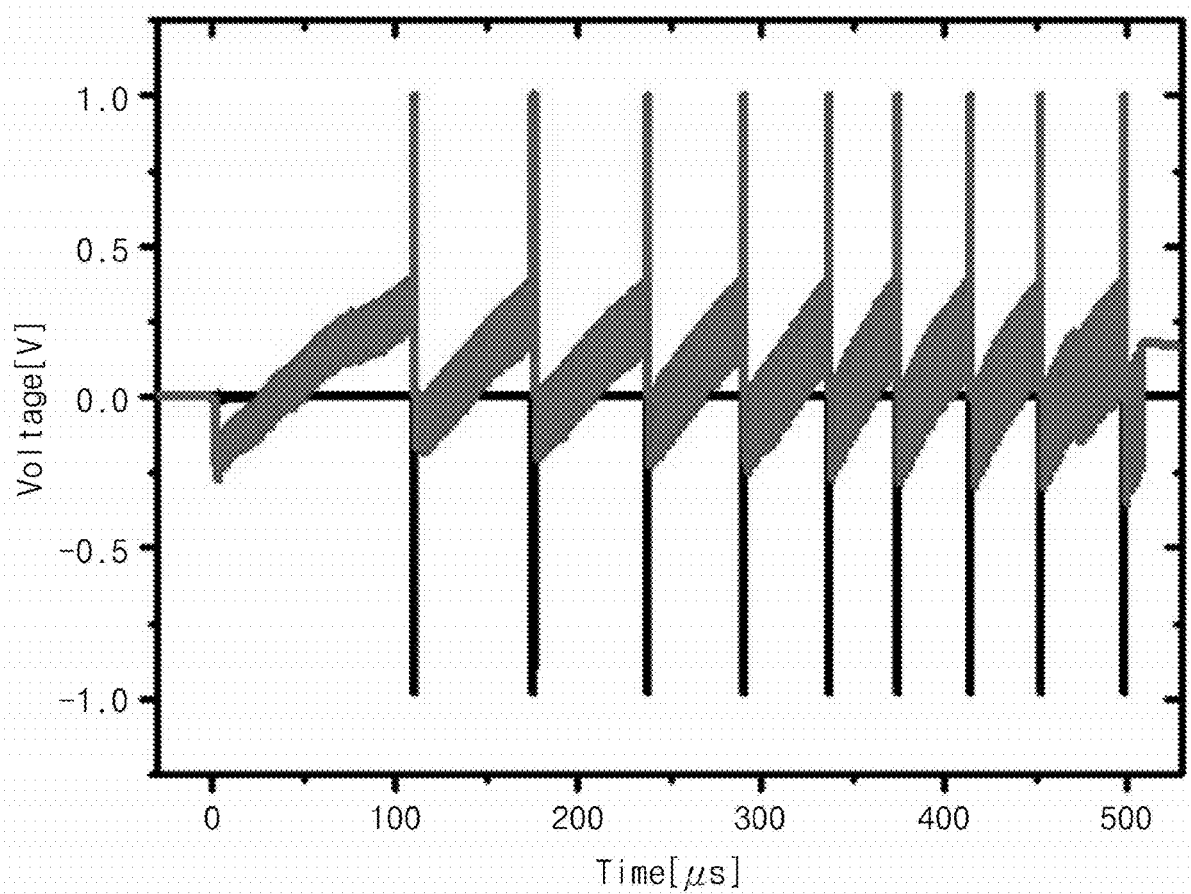

FIGS. 8 to 10 are views illustrating a pattern recognition simulation result of a neuron circuit, according to an embodiment of the inventive concept. FIGS. 11 to 12 are views illustrating a pattern recognition simulation result of a neuron circuit not having a function of retaining an overflow signal.

As illustrated in FIG. 8, the recognition of a handwriting pattern (MNIST) has been simulated for number '3' by 2833 28 synapse and a neuronal circuit. FIGS. 9 and 11 are views illustrating the frequency at which the neuron circuit recognizes the number on a vertical axis and fires. FIGS. 10 and 12 are views illustrating the output pulse of the neuron circuit and the cumulative voltage of the capacitor.

In the case of an embodiment of the inventive concept, as illustrated in FIGS. 9 and 10, it may be understood that the fire operation is performed on the number '3' totally ten times. On the other hand, in the case of the neuron circuit not having a function of retaining an overflow signal, as illustrated in FIGS. 11 and 12, it may be understood that the fire operation is performed on the number '3' totally nine times.

According to an embodiment of the inventive concept, the error rate of pattern recognition of the neuron circuit is 736/10000; the error rate of pattern recognition of the neuron circuit not having a function of retaining an overflow signal is 763/10000. In the case of the neuron circuit according to an embodiment of the inventive concept, the error rate of pattern recognition may be reduced by about 5%.

Figure 13:
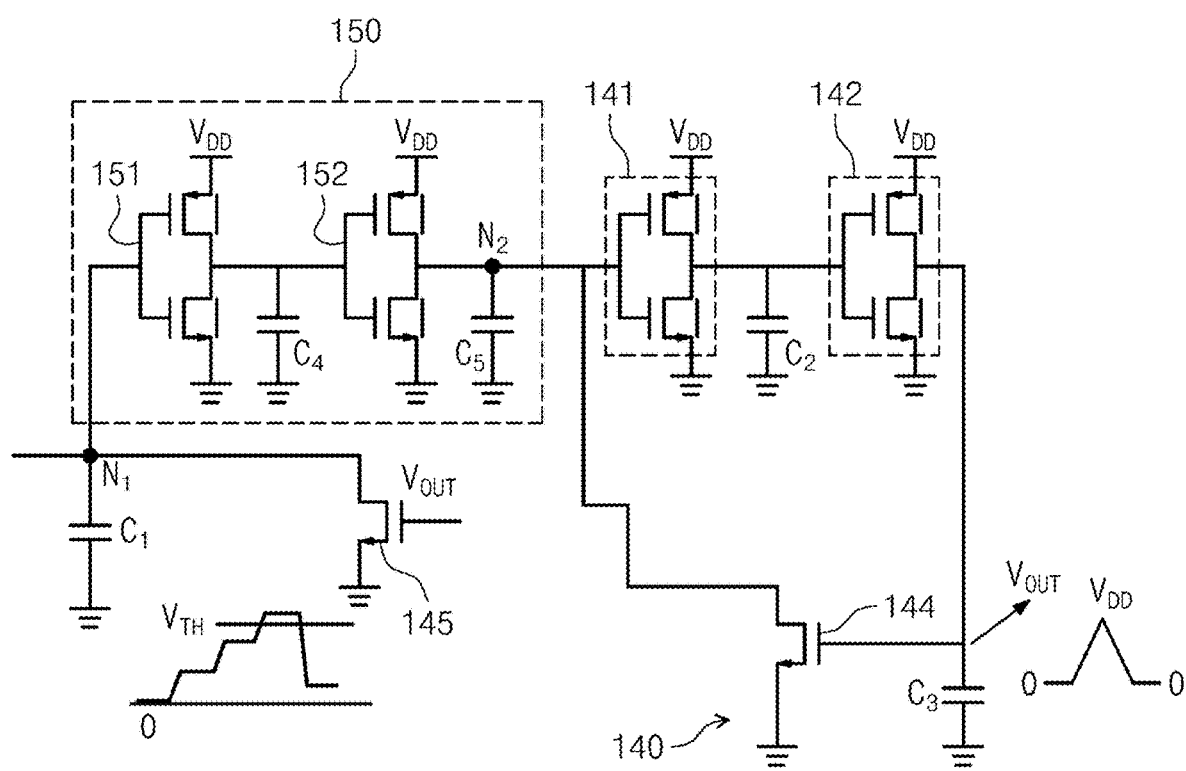
FIG. 13 is a configuration diagram of a neuron circuit, according to another embodiment of the inventive concept.

FIG. 13 is a configuration diagram of a neuron circuit, according to another embodiment of the inventive concept. The neuron circuit according to an embodiment of FIG. 13 may not include a first transistor for generating an asymmetrical output pulse, and there is the difference from the above-described embodiment in that the neuron circuit is configured to generate a symmetrical output pulse. In addition to the output pulse illustrated in FIG. 13, the pulse generation unit 140 may be provided to generate output pulses in various forms.

In the neuron circuit according to an embodiment of the inventive concept, the overflow signal is capable of being retained after fire, thereby reducing the error rate of pattern recognition and improving the accuracy of pattern recognition. The neuron circuit according to an embodiment of the inventive concept may be applied to various technologies that mimic biological neurons as a circuit, such as nervous system imitation AI, hardware the implementation of nervous systems, and hardware-based AI systems.

The above embodiment is provided to give an understanding of the inventive concept, the scope and spirit of the inventive concept is not be limited thereto, and various modifications possible embodiments therefrom are also understood within the scope of the inventive concept. The technical protection scope of the inventive concept will be defined by the technical spirit of the appended claims, the scope and spirit of the inventive concept is not limited to the wording of the claims, and it is to be understood that the technical value substantially affects the equivalent scope of the inventive concept.

According to an embodiment of the inventive concept, a neuron circuit in which the overflow signal before fire is retained after the fire may be provided.

The effect of the inventive concept is not limited to the above-mentioned effects. Other effects which are not mentioned will be clearly understood from the following description and accompanying drawings to those skilled in the art.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A neuron circuit comprising:
a synapse element configured to receive output signals of a pre-neuron circuit and a post-neuron circuit, a weight of the synapse element being changed depending on the output signals of the pre-neuron circuit and the post-neuron circuit;
a synaptic integration unit including a capacitor charged by a current flowing through the synapse element depending on the output signals of the pre-neuron circuit and the post-neuron circuit; and
a pulse generation unit configured to generate an output pulse from a charging voltage of the capacitor, the output pulse being fed back to the synapse element as the output signal of the post-neuron circuit,
wherein the pulse generation unit includes:
a pulse generation circuit configured to generate the output pulse depending on the charging voltage of the capacitor; and
an overflow signal retaining unit connected between the capacitor and the pulse generation circuit, the overflow signal retaining unit being configured to retain an overflow signal exceeding a threshold voltage among the charging voltage of the capacitor after the pulse generation unit fires.

2. The neuron circuit of claim 1, wherein the overflow signal retaining unit is reduced from the charging voltage of the capacitor by the threshold voltage upon firing of the pulse generation unit.

3. The neuron circuit of claim 1, wherein the overflow signal retaining unit includes:
a first inverter circuit configured to receive the charging voltage of the capacitor; and
a second inverter circuit configured to receive an output signal of the first inverter circuit,
wherein the overflow signal retaining unit is configured to copy the charging voltage of the capacitor to store the copied charging voltage in an output terminal of the second inverter circuit.

4. The neuron circuit of claim 3, wherein the overflow signal retaining unit further includes a capacitor element connected between the output terminal of the second inverter circuit and a ground.

5. The neuron circuit of claim 3, wherein the pulse generation circuit includes:
a first transistor having a gate, the charging voltage of the capacitor copied to the output terminal of the second inverter circuit being input to the gate of the first transistor;
a first inverter configured to invert the charging voltage of the capacitor copied to the output terminal of the second inverter circuit and output the inverted charging voltage;
a second inverter configured to invert an output signal of the first inverter and to output the inverted output signal to a drain or a source of the first transistor; and
a second transistor having a gate, an output signal of the second inverter being input to the gate of the second transistor, and the second transistor discharging an output terminal of the second inverter circuit depending on the output signal of the second inverter.

6. The neuron circuit of claim 5, wherein the pulse generation circuit further includes:
a third transistor having a gate, an output pulse of the second inverter being input to the gate of the third transistor,
wherein one of a drain and a source of the third transistor is connected to a charging terminal of the capacitor and the other is grounded.

7. The neuron circuit of claim 1, wherein the synapse element includes an excitation synapse element and an inhibition synapse element,
wherein the excitation synapse element includes a first transistor element,
wherein the inhibition synapse element includes a second transistor element,
wherein the output signal of the pre-neuron circuit is input to a first gate of each of the first transistor element and the second transistor element, and wherein the output signal of the post-neuron circuit is input to a second gate of each of the first transistor element and the second transistor element.

8. The neuron circuit of claim 1, wherein the synaptic integration unit further includes a current mirror connected between the synapse element and the capacitor, wherein the current mirror is connected to the excitation synapse element and the inhibition synapse element such that a current constantly flows through the excitation synapse element or the inhibition synapse element depending on the output signals of the pre-neuron circuit and the post-neuron circuit, and outputs a differential current between the excitation synapse element and the inhibition synapse element to the capacitor, and wherein the capacitor is isolated from the current flowing through the excitation synapse element and the inhibition synapse element by the current mirror and is charged by the differential current.

* * * * *